(12) United States Patent
Benedict et al.

(10) Patent No.: US 11,122,692 B1
(45) Date of Patent: Sep. 14, 2021

(54) PREPARATION OF SOLDER BUMP FOR COMPATIBILITY WITH PRINTED ELECTRONICS AND ENHANCED VIA RELIABILITY

(71) Applicant: RAYTHEON COMPANY, Waltham, MA (US)

(72) Inventors: James E. Benedict, Lowell, MA (US); Gregory G. Beninati, Salem, NH (US); Mikhail Pevzner, Woburn, MA (US); Thomas V. Sikina, Acton, MA (US); Andrew R. Southworth, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/898,930

(22) Filed: Jun. 11, 2020

(51) Int. Cl.
*H05K 3/34* (2006.01)
*H05K 3/00* (2006.01)

(52) U.S. Cl.
CPC ........ *H05K 3/3485* (2020.08); *H05K 3/0044* (2013.01); *H05K 2203/041* (2013.01); *H05K 2203/043* (2013.01); *H05K 2203/046* (2013.01)

(58) Field of Classification Search
CPC .............. H05K 3/348; H05K 3/0044; H05K 2203/046; H05K 2203/043; H05K 2203/041; H01L 21/4853; Y10T 29/49174; Y10T 29/49149; Y10T 29/49155
USPC .................................. 29/831, 842, 843, 846
See application file for complete search history.

(56) References Cited

U.S. PATENT DOCUMENTS

| | | | |
|---|---|---|---|
| 5,675,180 A * | 10/1997 | Pedersen | H01L 23/5382 257/685 |
| 6,267,650 B1 * | 7/2001 | Hembree | H01L 21/4853 451/49 |
| 8,629,543 B2 * | 1/2014 | McElrea | H01L 25/0657 257/686 |
| 10,091,888 B2 * | 10/2018 | Lan | H03H 1/00 |

* cited by examiner

*Primary Examiner* — Donghai D Nguyen
(74) *Attorney, Agent, or Firm* — Lando & Anastasi, LLP

(57) ABSTRACT

A process of fabricating a circuit includes providing a first sheet of dielectric material including a first top surface having at least one first conductive trace and a second sheet of dielectric material including a second top surface having at least one second conductive trace, depositing a first solder bump on the at least one first conductive trace, applying the second sheet of dielectric material to the first sheet of dielectric material with bonding film sandwiched in between, bonding the first and second sheets of dielectric material to one another, and providing a conductive material to connect the first solder bump on the at least one first conductive trace to the at least one second conductive trace.

12 Claims, 3 Drawing Sheets

PREPARATION OF SOLDER BUMP FOR COMPATIBILITY WITH PRINTED ELECTRONICS AND ENHANCED VIA RELIABILITY

GOVERNMENT RIGHTS

Not applicable.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace (e.g., stripline) dimensions, and dimensions of dielectric materials between conductors (e.g., dielectric thickness, inter-via spacing, etc.), thereby limiting the range of highest frequency signals that may be supported by such circuits.

Signal conductors (e.g., signal traces, strip lines, interlayer "vertical" feeds) and reference surfaces and conductors (e.g., ground planes, Faraday boundaries or "walls") within various circuits are suitable for various circuit board manufacturing, including radio frequency circuit embodiments. Additive and subtractive manufacturing techniques provide structures for conveyance and containment of various signals, and particularly of radio frequency signals in microwave and millimeter wave ranges.

In the PCB process, after the bonding process has been completed, the circuit board is usually placed in an acid bath to remove the oxidation from the copper trace. This can also be completed before bonding during a sequential lamination process. This is a wet process that can impact previously printed circuits made from silver nano-particles instead of the typical copper plating processes. If this acid bath process is not used, lasers can be used to ablate bond film and clean oxidation from the surfaces of circuit board inside of shallow holes, but the depth of some of the holes used for this printed electronic approach can make this process difficult because the laser is only designed for shallow holes. Lasers also may not be able to remove the solder efficiently, leading to longer build times than found with an acid bath. Ramp-like and vertical structures can be created to make printed interconnections within a multi-layer printed circuit board, but connecting a silver nano-particle trace to a copper trace can be difficult because of the dis-similar metals, as well as the oxidation layer that is formed during the bonding process. A ramp-like structure may be created with A milling operation after a multi-layer lamination process. However, after the lamination process the copper traces still are oxidized, so when printed, the trace will not make very good contact between the two surfaces. To be used in a critical application, better adhesion is required.

SUMMARY

One aspect of the present disclosure is directed to a process of fabricating a circuit. In one embodiment, the process comprises: providing a first sheet of dielectric material including a first top surface having at least one first conductive trace and a second sheet of dielectric material including a second top surface having at least one second conductive trace; depositing a first solder bump on the at least one first conductive trace; applying the second sheet of dielectric material to the first sheet of dielectric material with bonding film sandwiched in between; bonding the first and second sheets of dielectric material to one another; and providing a conductive material to connect the first solder bump on the at least one first conductive trace to the at least one second conductive trace.

Embodiments of the process further may include depositing a second solder bump on the at least one second conductive trace. The process further may include removing a portion of the second sheet of dielectric material between the first solder bump and the second solder bump to create a ramp therebetween. Removing a portion of the second sheet of dielectric material may include using a milling process to remove the portion. The process further may include removing a portion of at least one of the first solder bump and the second solder bump to provide a clean surface for soldering. Removing a portion of the at least one of the first solder bump and the second solder bump may include using a milling process to remove the portion. The conductive interconnection may be performed by an aerosol jet process configured to use aerodynamic focusing to precisely and accurately deposit electronic inks between the first solder bump and the second solder bump. The first solder bump may be located between the first sheet of the dielectric material and the second sheet of dielectric material. The second conductive trace may include a ground plane. The process further may include creating a through hole from the second sheet of dielectric material, the first solder bump and the first sheet of dielectric material. The conductive material may be applied to walls of the through hole. The conductive material may include a solder ball, formed of solder paste material, disposed above the through hole, with the solder ball being reflowed so that the solder paste material is drawn through the through hole. The solder paste material may be drawn through the through hole by a vacuum process to coat the walls of the through hole. The first solder bump may include lead-based or lead-free solder. Bonding the first and second sheets of dielectric material to one another may include curing the sheets under pressure and temperature to form an integral final product.

Another aspect of the present disclosure is directed to a circuit comprising a first sheet of dielectric material including a first top surface having at least one first conductive trace, and a second sheet of dielectric material including a second top surface having at least one second conductive trace. The second sheet of dielectric material is bonded to the first sheet of dielectric material with bonding film. The circuit further comprises a first solder bump provided on the at least one first conductive trace and a conductive material configured to connect the first solder bump on the at least one first conductive trace to the at least one second conductive trace.

Embodiments of the circuit further may include a second solder bump on the at least one second conductive trace. The circuit further may include a ramp created by removing a portion of the second sheet of dielectric material between the first solder bump and the second solder bump. The first solder bump may be located between the first sheet of the dielectric material and the second sheet of dielectric material. The circuit further may include a through hole from the second sheet of dielectric material, the first solder bump and the first sheet of dielectric material. The conductive material may be applied to walls of the through hole.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION

Figure 1:
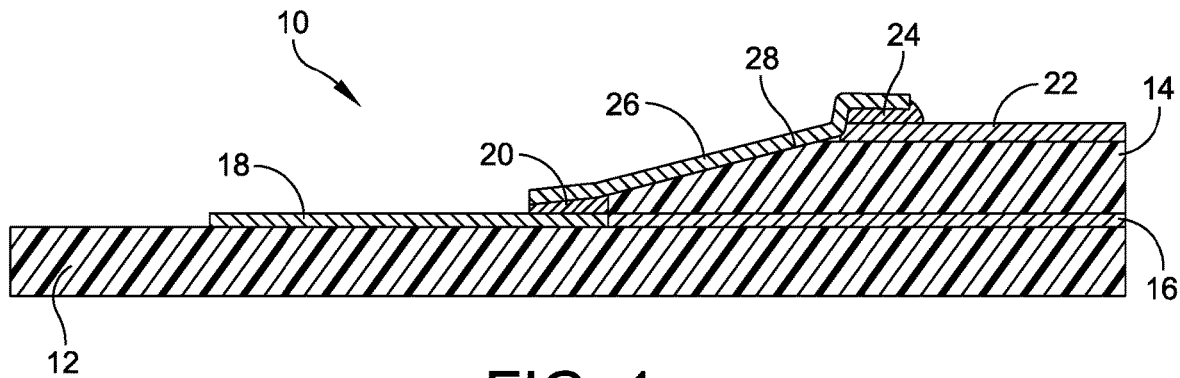
FIG. 1 is a cross-sectional view of a printed circuit board (PCB) package of an embodiment of the present disclosure.

Manufacturing processes described herein may be particularly suitable for fabrication of such circuit structures having small circuit features capable of supporting electromagnetic signals in the range of 8 to 75 GHz or more. Electromagnetic and radio frequency (RF) circuit structures in accord with methods described herein may be particularly suitable for application in 28 to 70 GHz systems, including millimeter wave communications, sensing, ranging, etc. Aspects and embodiments described may also be suitable for lower frequency ranges, such as in the S-band (2-4 GHz), X-band (8-12 GHz), or others.

The processes described herein may support smaller arrangements and dimensions than conventional processes are capable. Such conventional circuit boards may be limited to frequencies below about 30 GHz. The processes described herein may allow or accommodate the manufacture of circuits of smaller dimensions, suitable for radio frequency circuits intended to be operated at higher frequencies, using safer and less complex manufacturing, and at lower cost.

Circuits and processes of manufacture in accord with those described herein include laminating techniques to produce electromagnetic and radio frequency circuits and components capable of handling higher frequencies, with lower profiles, and at reduced costs, cycle times, and design risks, than conventional circuits and processes. Examples of techniques include laminating sheets of standard printed circuit board (PCB) laminates, i.e., dielectric material having copper traces, on one another.

Any of the above example techniques and/or others may be combined to make various components and/or circuits. Aspects and examples of such techniques are described and illustrated herein with respect to a radio frequency interconnect to contain and convey a signal along a layer of a circuit in one dimension and vertically through to other layers of the circuit in another dimension. The techniques described herein may be used to form various components, connectors, circuits, assemblies, and systems. In addition, these techniques can be used to create direct current (DC) connections.

Multilayer printed circuit boards can be configured to enable digital and RF circuitry into a single assembly. This construction decreases the overall size of the printed circuit board. Multilayer printed circuit boards may be bonded using a low dielectric constant, low loss sheet adhesive or bonding film. In one example, the bond film may include a thermoplastic chloro-fluorocopolymer, which has a low dielectric constant PTFE (Teflon® fluorocarbon polymer) suited for microwave stripline packages and other multilayer circuits. In another example, the bond film may include a thermosetting, epoxy-based, silver-filled adhesive film that is used to bond circuit boards to heavy clad metal backplanes, heat sinks and RF module housings. In yet another example, the bond film may include an unreinforced, hydrocarbon-based thin film adhesive particularly suited for high performance, high reliability multi-layer constructions. The bond film can also be used to bond other structural and electrical components to the dielectric. Bond film materials can be used in lamination processes familiar to most circuit fabrication shops. In one embodiment, the bond film is available in a thickness of 0.0015 inch (in) (0.381 millimeter (mm)), in continuous 12 in (305 mm) wide rolls, on standard 3 in inner diameter cores. Other bonding film materials further may be provided.

The present disclosure is directed to a manufacturing method for forming solder bump interconnections both internal and external to a printed circuit board (PCB) fabricated by processes used to create microwave and digital PCBs. Promoting adhesion between a printed electronics trace and a copper line can be difficult, especially in keeping the copper extremely clean and free of oxidation. Embodiments disclosed herein are directed to two application processes to promote the adhesion of conductive material to a copper trace by protecting and removing the oxidation layer that forms after the printed circuit board is bonded together. By applying a solder bump to the copper trace on either a ramp approach or a through hole approach, copper is protected from oxidation during the lamination process. After solder has either been milled or drilled through, fresh solder and copper line that is not oxidized is exposed, thereby providing a better surface for any conductive material to bond or plate to. These processes remove a wet process step from the PCB process. Milling and drilling through the solder bump on the top of a board to planarize and expose the non-oxidized solder surfaces on the interior of the bump can help promote adhesion of conductive material in both a printed electronics application and conventional plating operation.

Embodiments of the processes disclosed herein employ providing a solder bump and milling operations to prepare a trace that is internal or external to a board to accept a printed electronics trace. The processes remove an oxidation layer that is on the copper traces after the circuit board has been laminated together. Removing this oxidation layer is beneficial to the adhesion of a printed electronics trace when using hybrid manufacturing processes to create circuit boards. The processes include two different applications, one where a ramp-like interface is created, and one where a conventional via system is created, are applicable.

Embodiments of the present disclosure are directed to protecting a copper trace with a piece of solder over the top of the trace in order to facilitate printed electronics. This approach applies a solder bump to the copper that is exposed during the lamination process. After lamination, a milling machine removes part of the solder bump for both applications and exposing fresh solder. In one embodiment, an aerosol jet or via filling machine is then used to create the interconnection.

The processes include milling through the solder bump on the top of a board to planarize and expose the non-oxidized solder surfaces on the interior of the bump. The processes further include drilling through a solder bump on the interior of the board to expose the non-oxidized solder surface on the interior of the bump. Both processes above are applied to printed electronics or any conductive material processes to promote adhesion between the connection trace or via and the copper traces on the circuit board.

Referring to the drawings, and more particularly to FIG. 1, a circuit of an embodiment of the present disclosure is generally indicated at 10. As shown, the circuit 10 includes a first dielectric layer 12 and a second dielectric layer 14 applied to a top surface of the first dielectric layer. As shown, the second dielectric layer 14 is laminated to the first dielectric layer 12. A layer of bonding film 16 may be used to assist in achieving the lamination of the first dielectric layer 12 and the second dielectric layer 14. Exemplary dielectric materials may include glass-reinforced epoxy laminate material, e.g., FR-4. Other materials may be provided.

As known, the electronic circuit 10 can be part of a PCB, which includes a flat sheet of dielectric material having a layer of copper applied to the sheet. The copper layer is formed into conductive lines and traces, including pads by chemical etching or other appropriate processes. A PCB can be configured to include multiple layers having multiple laminate sheets, with bonding films being provided between the laminate sheets to secure the laminate sheets to one another during curing. In the shown embodiment, the second dielectric layer 14 is applied to the first dielectric layer 12 to form a ramp between the dielectric layers. Other structures may be formed.

The circuit 10 further includes a conductive trace 18 disposed on a top surface of the first dielectric layer 12. The conductive trace 18 includes a solder bump 20, which may be deposited on a pad of the conductive trace. The solder bump 20 can be any type of solder, e.g., lead-based or lead-free solder. The solder bump 20 can be provided to secure a component on the first dielectric layer 12. Similarly, the circuit 10 further includes a conductive trace 22 disposed on a top surface of the second dielectric layer 14. The conductive trace 22 includes a solder bump 24, which also may be deposited on a pad of the conductive trace. The solder bump 24 also can be provided to secure a component on the second dielectric layer 14.

The circuit 10 further includes a ramp surface that is formed by milling along a continuous path through solder bump 20, dielectric layer 14, part of the conductive trace 22, and solder bump 24. The circuit 10 further includes a conductive interconnection 26, e.g., solder paste or conductive ink, applied on and between the solder bump 20 on the conductive trace 18 of the first dielectric layer 12 and on and to the solder bump 24 on the conductive trace 22 of the second dielectric layer 14. In one embodiment, the conductive interconnection 26 may be achieved by an aerosol jet process configured to use aerodynamic focusing to precisely and accurately deposit electronic materials, e.g., electronic inks, onto substrates. In one process, an electronic ink is placed into an atomizer, which creates a dense mist of material laden droplets. Printed features of the electronic ink used to create the conductive interconnection can range from ten (10) microns to millimeters.

In one embodiment, the second dielectric layer 14 can be fabricated from the same material as the first dielectric layer 12. However, the second dielectric layer 14 can be fabricated from a different material than the first dielectric layer 12. Although two dielectric layers 12, 14 are shown, additional dielectric layers may be provided to create multiple layers. Once stacked, the dielectric layers 12, 14 are cured under pressure and temperature to form an integral final product having a uniform thickness.

The process can remove a desired amount of solder from the solder bumps 20, 24 to result in solder bumps having a precisely controlled amount or volume of solder. This process can also be used to present clean top surfaces on the solder bumps 20, 24 for soldering a copper wire or other electrical component to the solder bumps.

Figure 2:
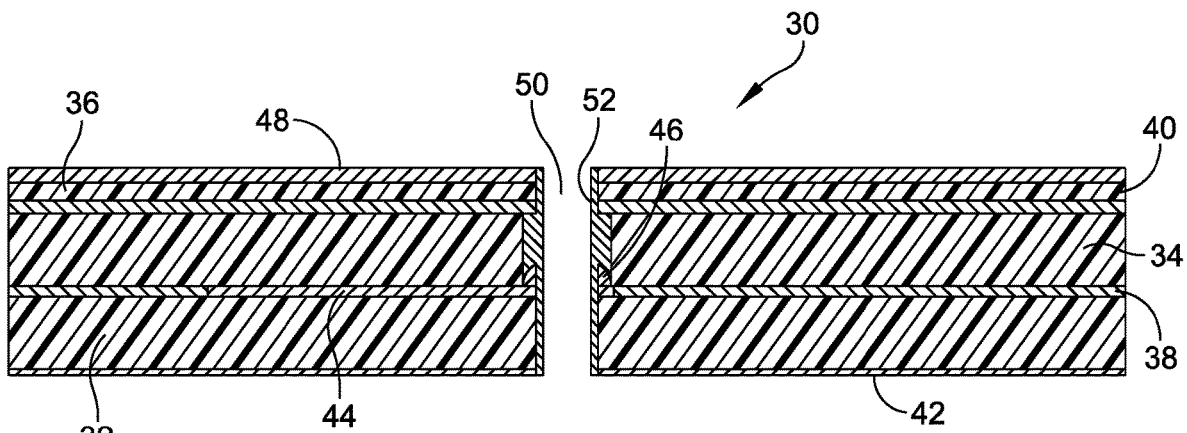
FIG. 2 is a cross-sectional view of a PCB package of another embodiment of the present disclosure.

Referring to FIG. 2, a circuit of another embodiment of the present disclosure is generally indicated at 30. As shown, the circuit 30 includes a first dielectric layer 32, a second dielectric layer 34 applied to a top surface of the first dielectric layer, and a relatively thin third dielectric layer 36 applied to a top surface of the second dielectric layer. As shown, the second dielectric layer 34 is laminated to the first dielectric layer 32 and the third dielectric layer 36 is laminated to the second dielectric layer 34. A layer of bonding film 38 may be used to achieve the lamination of the second dielectric layer 34 to the first dielectric layer 32. Another layer of bonding film 40 may be used to achieve the lamination of the third dielectric layer 36 to the second dielectric layer 34.

The circuit further includes a ground plane 42 disposed on a bottom surface of the first dielectric layer 32 and a conductive trace 44 disposed on a top surface of the first dielectric layer. The conductive trace 44 includes a solder bump 46, which may be deposited on a pad of the conductive trace prior to lamination. Similarly, the circuit 30 further includes a conductive trace or ground plane 48 disposed on a top surface of the third dielectric layer 36. As shown, the conductive trace 44 is disposed between the first dielectric layer 32 and the second dielectric layer 34, with the second dielectric layer being laminated to the first dielectric layer with the layer of bonding film 38. The third dielectric layer 36 is laminated to the second dielectric layer 34 with the layer of bonding film 40. A through hole 50 is provided between the first dielectric layer 32, the second dielectric layer 34 and the third dielectric layer 36. Through-hole mounting may be used for some large components, such as capacitors and connectors.

The circuit 30 further includes a conductive interconnection 52, e.g., solder paste, applied to surfaces of the through hole 50 to create an electrical connection between the ground plane 42 of the first dielectric layer 32, the conductive trace 44 and solder bump 46 disposed between the first dielectric layer 32 and the second dielectric layer 34, and the conductive trace or ground plane 48 on the third dielectric layer 36. In one embodiment, the conductive interconnection 52 may be achieved by applying a solder ball on top of the through hole, reflowing the solder ball, and drawing solder through the through hole by a vacuum process, for example. In other embodiments, the conductive interconnection 52 can be achieved by applying a conductive ink or through some other known process.

In one embodiment, the second dielectric layer 34 and/or the third dielectric layer 36 can be fabricated from the same material as the first dielectric layer 32. However, the second dielectric layer 34 and/or the third dielectric layer 36 can be fabricated from a different material than the first dielectric layer 32. Although three dielectric layers 32, 34, 36 are shown, additional dielectric layers may be provided to create multiple layers. Moreover, only two dielectric layers, e.g., dielectric layers 32, 34 may be provided. Once stacked, the dielectric layers 32, 34, 36 are cured under pressure and temperature to form an integral final product having a uniform thickness.

Figure 3:
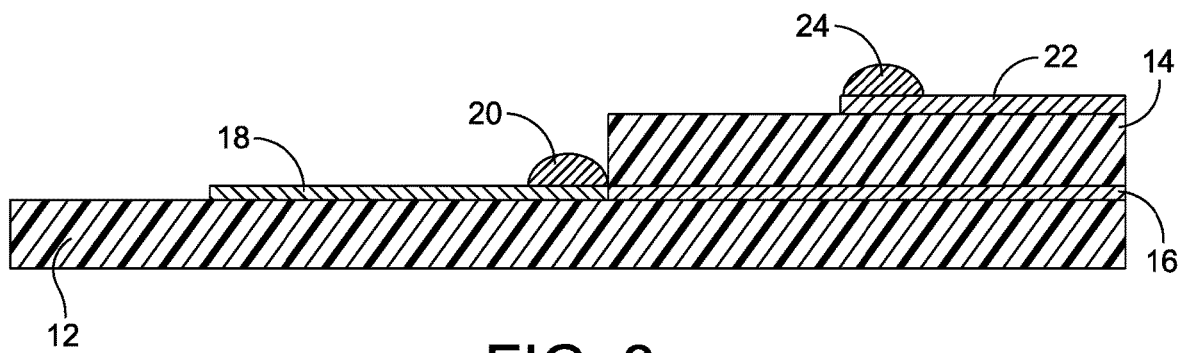
FIGS. 3-5 are cross sectional views showing a sequence of steps used to create the PCB package shown in FIG. 1.
Figure 4:
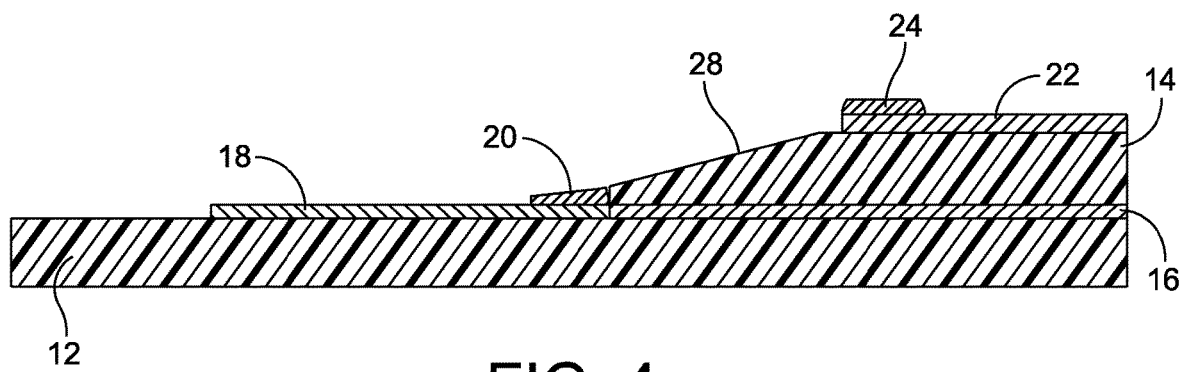
Figure 5:
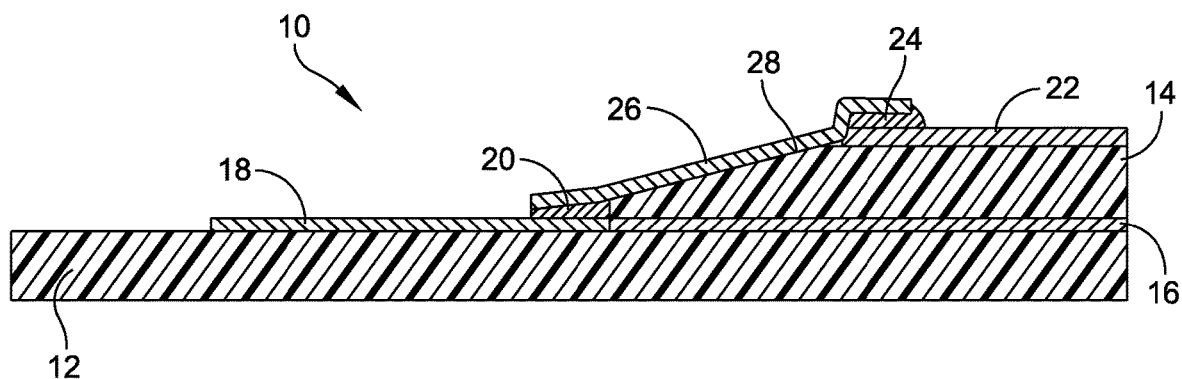

The process of creating the electronic circuit 10 is shown with reference to FIGS. 3-5. As shown in FIG. 3, the second dielectric layer 14 is laminated to the first dielectric layer 12. The first dielectric layer 12 includes the conductive trace 18 and the solder bump 20. The layer of bonding film 16 is disposed between the first dielectric layer 12 and the second dielectric layer 14 to assist in laminating the layers together. The second dielectric layer 14 includes the conductive trace 22 having the solder bump 24.

Referring to FIG. 4, an end mill operation can be employed to remove part of the solder bump 20 on the conductive trace 18 of the first dielectric layer 12 and part of the solder bump 24 of the conductive trace 22 from the second dielectric layer 14. The end mill operation further can be used to remove part of the second dielectric layer 14 to create a ramp 28 between the solder bump 20 on the first dielectric layer 12 and the solder bump 24 on the second dielectric layer 14. In one embodiment, the end mill operation can use rotary cutters to perform the removal of unwanted material. In another embodiment, a more formal process can be employed.

Referring to FIG. 5, the conductive interconnection 26 is dispensed on and from the solder bump 20 on the conductive trace 18 of the first dielectric layer 12 to and on the solder bump 24 on the conductive trace 22 of the second dielectric layer 14. In one embodiment, the conductive interconnection 26 includes a silver nanoparticle paste applied, as by spraying, to improve the connection of conductive traces 18, 22 having the solder bumps 20, 24. The paste constitutes a very thin layer of silver nanoparticles on the top surface of the solder bumps 20, 24 and the intervening ramp 28. This conductive interconnection 26 can be considered another conductive trace of the circuit 10. As discussed above, the conductive interconnection 26 may be achieved by an aerosol jet process configured to precisely deposit electronic inks onto substrates. Once applied, the circuit 10 is complete.

Figure 6:
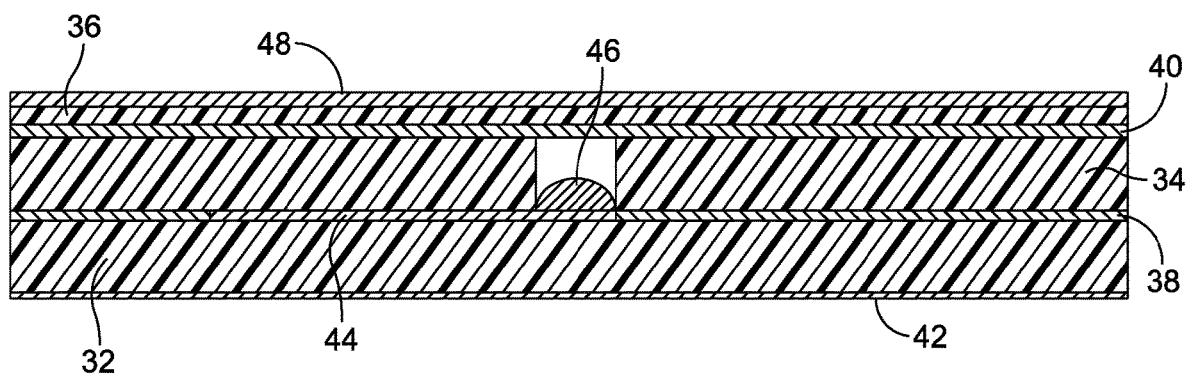
FIGS. 6-9 are cross-sectional views showing a sequence of steps used to create the PCB package shown in FIG. 2.

The process of creating the electronic circuit 30 is shown with reference to FIGS. 6-9. As shown in FIG. 6, the second dielectric layer 34 is laminated to the first dielectric layer 32 and the third dielectric layer 36 is laminated to the second dielectric layer 34. The first dielectric layer 32 includes the conductive trace 44 and the solder bump 46. The layer of bonding film 38 is disposed between the first dielectric layer 32 and the second dielectric layer 34 and between the third dielectric layer 36 and the second dielectric layer 34 to assist in laminating the layers together. The first dielectric layer 32 includes the ground plane 42 and the third dielectric layer 36 includes the ground plane 48.

Figure 7:
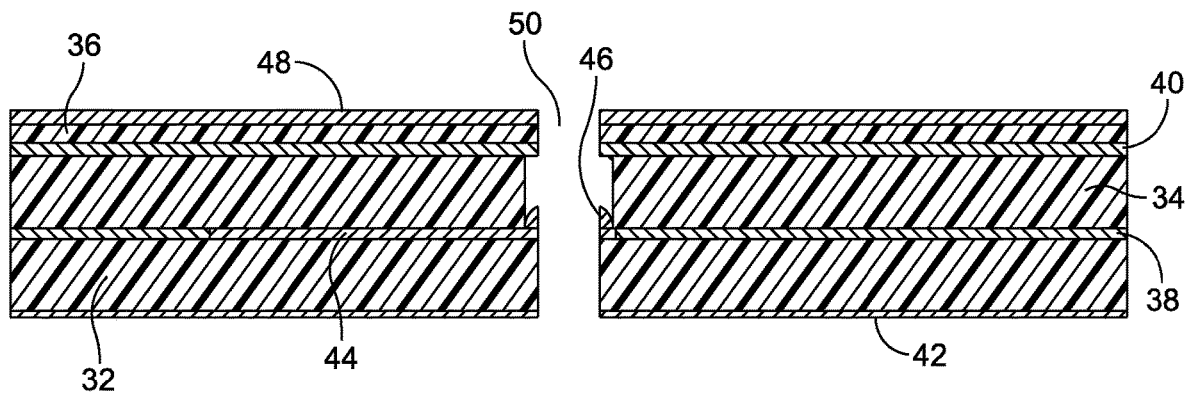

Referring to FIG. 7, the through hole 50 is drilled through a center of the solder bump 46, from the third dielectric layer 36, the solder bump 46, and the first dielectric layer 32. In one embodiment, a drilling or an end mill operation can be employed to drill or mill the through hole 50. When employing a drill, for example, a drill bit is applied to a drill press to create the through hole 50. When employing an end mill, rotary cutters to create the through hole 50.

Figure 8:
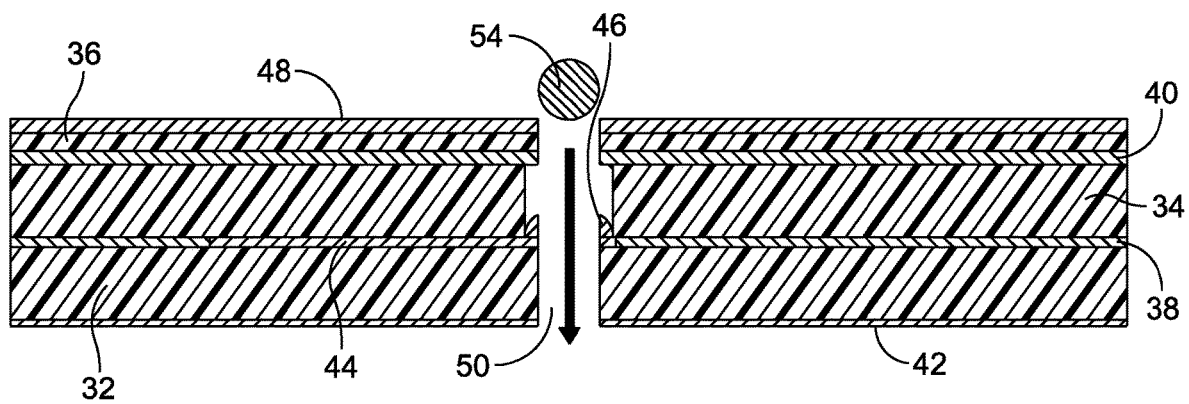

Referring to FIG. 8, once the through hole 50 is formed, conductive material is applied to the walls of the through hole to create the conductive interconnection 52. In one embodiment, a solder ball 54, formed of solder paste material, is disposed above the through hole 50. In a certain embodiment, the solder ball 54 is reflowed so that the solder paste material is drawn through the through hole. In another embodiment, the solder ball 54 can be positioned below the through hole 50 and drawn up through the through hole. In yet another embodiment, solder paste is provided in liquid form.

Figure 9:
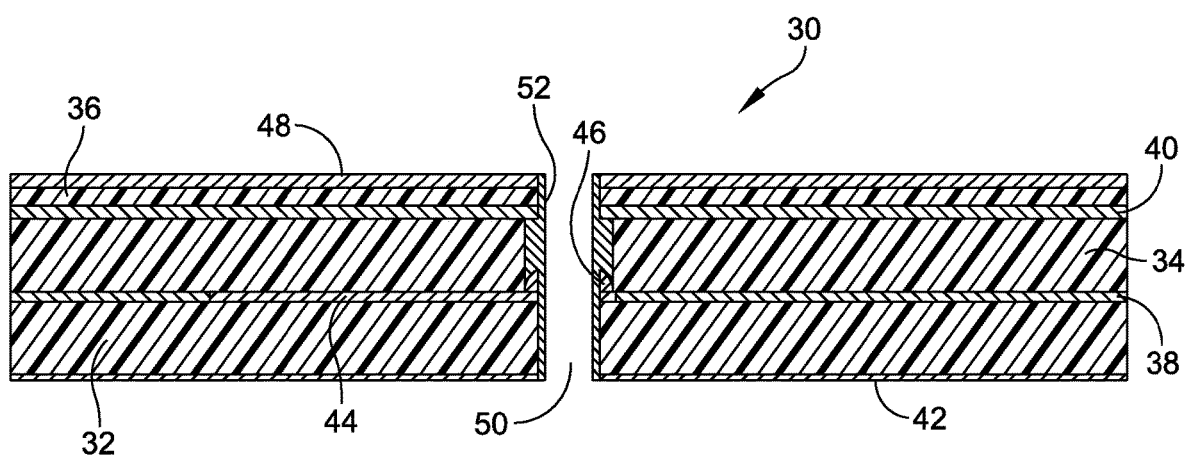

Referring to FIG. 9, the solder paste or suitable conductive material, e.g., a silver nano-particle ink, is drawn through the through hole 50 by a vacuum process. In the shown embodiment, the solder paste coats the walls of the through hole 50 to create larger contact area for conductive material to connect to the internal conductive trace 44. Once the conductive interconnection 52 is created, the circuit 30 is complete.

It is to be appreciated that embodiments of the processes discussed herein are not limited in application to the details of construction and the arrangement of components set forth in the following description or illustrated in the accompanying drawings. The processes are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and processes or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, processes in accord with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

It should be appreciated that the methods described herein can be employed on circuit designs having varying geometries, sizes and number of layers. The methods described herein are exemplary, and are not limited to circuit design described and shown herein.

In some embodiments, the resulting circuit board structure is merely an example and portion of a structure in which a circuit may be provided. Further extent of the substrates shown may accommodate various circuit components, and additional substrates having additional layers to accommodate additional circuit components may be provided in various embodiments. Typically, a portion of a circuit may be disposed on a particular layer, and may include ground planes above and/or below, and other portions of a total circuit (or system) may exist at different regions of the same layer or on other layers.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A process of fabricating a printed circuit board, the process comprising:
   providing a first sheet of dielectric material including a first top surface having at least one first conductive trace and a second sheet of dielectric material including a second top surface having at least one second conductive trace;
   depositing a first solder bump on the at least one first conductive trace;
   applying the second sheet of dielectric material to the first sheet of dielectric material with bonding film sandwiched in between;
   bonding the first and second sheets of dielectric material to one another;
   providing a conductive material to connect the first solder bump on the at least one first conductive trace to the at least one second conductive trace;
   depositing a second solder bump on the at least one second conductive trace; and
   removing a portion of the second sheet of dielectric material between the first solder bump and the second solder bump to create a ramp between the first solder bump and the second solder bump,
   wherein the ramp is formed by milling along a continuous path through the first solder bump, the second sheet of dielectric material, the at least one second conductive trace, and the second solder bump.

2. The process of claim 1, further comprising removing a portion of the first solder bump and the second solder bump to provide a clean surface for soldering.

3. The process of claim 2, wherein removing a portion of the first solder bump and the second solder bump includes using a milling process to remove the portion.

4. The process of claim 1, wherein the conductive interconnection is performed by an aerosol jet process configured to use aerodynamic focusing to precisely and accurately deposit electronic inks between the first solder bump and the second solder bump.

5. The process of claim 1, wherein the first solder bump is located between the first sheet of the dielectric material and the second sheet of dielectric material.

6. The process of claim 5, wherein the second conductive trace includes a ground plane.

7. The process of claim 6, further comprising creating a through hole from the second sheet of dielectric material, the first solder bump and the first sheet of dielectric material.

8. The process of claim 7, wherein the conductive material is applied to walls of the through hole.

9. The process of claim 8, wherein the conductive material includes a solder ball, formed of solder paste material, disposed above the through hole, the solder ball being reflowed so that the solder paste material is drawn through the through hole.

10. The process of claim 9, wherein the solder paste material is drawn through the through hole by a vacuum process to coat the walls of the through hole.

11. The process of claim 1, wherein the first solder bump includes lead-based or lead-free solder.

12. The process of claim 1, wherein bonding the first and second sheets of dielectric material to one another includes curing the sheets under pressure and temperature to form an integral final product.

* * * * *